(12) United States Patent
Feng et al.

(10) Patent No.: US 8,518,281 B2
(45) Date of Patent: Aug. 27, 2013

(54) ACID-RESISTANCE PROMOTING COMPOSITION

(76) Inventors: Kesheng Feng, Cheshire, CT (US);
Ming De Wang, Naugatuck, CT (US);
Colleen Mckirryher, Thomaston, CT (US); Steven A. Castaldi, Torrington, CT (US)

(*) Notice: Subject to any disclaimer, the term of this patent is extended or adjusted under 35 U.S.C. 154(b) by 1485 days.

(21) Appl. No.: 12/156,613

(22) Filed: Jun. 3, 2008

(65) Prior Publication Data
US 2009/0294294 A1    Dec. 3, 2009

(51) Int. Cl.
*C03C 15/00*    (2006.01)

(52) U.S. Cl.
USPC .......... 216/34; 216/56; 216/83; 216/95; 216/105; 252/79.1; 252/79.2; 252/79.4; 252/79.5

(58) Field of Classification Search
USPC .......... 216/34, 56, 83, 95, 105; 252/79.1, 252/79.2, 79.3, 79.4, 79.5
See application file for complete search history.

(56) References Cited

U.S. PATENT DOCUMENTS

| | | | |
|---|---|---|---|
| 2,861,907 A | 11/1958 | Butler | |
| 4,042,323 A | 8/1977 | Redmore | |
| 4,308,072 A | 12/1981 | Schneider et al. | |
| 5,037,482 A * | 8/1991 | Kukanskis et al. | 134/3 |
| 5,468,399 A * | 11/1995 | Delfort et al. | 508/433 |
| 5,800,859 A | 9/1998 | Price et al. | |
| 5,800,930 A | 9/1998 | Chen et al. | |
| 5,807,493 A | 9/1998 | Maki et al. | |
| 6,087,704 A * | 7/2000 | Chang et al. | 257/472 |
| 6,156,221 A * | 12/2000 | Lauffer et al. | 216/105 |
| 6,294,220 B1 | 9/2001 | McGrath et al. | |
| 6,383,272 B1 | 5/2002 | Ferrier | |
| 6,426,020 B1 | 7/2002 | Okada et al. | |
| 6,503,566 B2 | 1/2003 | Ferrier | |
| 6,521,139 B1 * | 2/2003 | Kondo et al. | 216/108 |
| 6,544,436 B2 | 4/2003 | Morikawa et al. | |
| 6,554,948 B1 | 4/2003 | Ferrier | |
| 6,573,223 B1 | 6/2003 | Vinci | |
| 6,666,987 B1 | 12/2003 | Morikawa et al. | |
| 6,679,983 B2 | 1/2004 | Morrissey et al. | |
| 6,844,263 B2 * | 1/2005 | Shimazu et al. | 438/692 |
| 6,902,626 B2 | 6/2005 | Morikawa et al. | |
| 6,911,393 B2 * | 6/2005 | Nosowitz et al. | 438/678 |
| 6,946,027 B2 | 9/2005 | Bernards et al. | |
| 7,063,800 B2 | 6/2006 | Ding et al. | |
| 7,108,795 B2 | 9/2006 | Bernards et al. | |
| 7,153,449 B2 | 12/2006 | Hauf et al. | |
| 7,186,305 B2 | 3/2007 | Ferrier | |
| 7,351,353 B1 | 4/2008 | Bernards et al. | |
| 7,563,315 B2 * | 7/2009 | Bernards et al. | 106/287.11 |
| 7,645,393 B2 * | 1/2010 | Feng et al. | 216/106 |
| 7,807,016 B2 * | 10/2010 | Schwoeppe et al. | 156/331.7 |
| 2003/0213553 A1 | 11/2003 | Bernards et al. | |
| 2005/0236359 A1 * | 10/2005 | Hu | 216/34 |
| 2005/0238811 A1 * | 10/2005 | Bernards et al. | 427/299 |
| 2007/0037920 A1 * | 2/2007 | Kulling et al. | 524/500 |
| 2008/0317962 A1 * | 12/2008 | Hayes et al. | 427/409 |

* cited by examiner

*Primary Examiner* — Nadine Norton
*Assistant Examiner* — Christopher Remavege
(74) *Attorney, Agent, or Firm* — Carmody & Torrance LLP

(57) ABSTRACT

A composition for providing acid resistance to copper surfaces in the production of multilayered printed circuit boards. The composition comprises an acid, an oxidizer, a five-membered heterocyclic compound and a thiophosphate or a phosphorous sulfide compound. In a preferred embodiment, the phosphorous compound is phosphorus pentasulfide. The composition is applied to a copper or copper alloy substrate and the copper substrate is thereafter bonded to a polymeric material.

9 Claims, 3 Drawing Sheets
(3 of 3 Drawing Sheet(s) Filed in Color)

The color comparison of copper foil surfaces: H stands for High flow; L stands for Low Flow The color comparison of copper foil surfaces: H stands for High flow; L stands for Low Flow The color comparison of laminated Resin with copper core after soldering: H for High flow

ACID-RESISTANCE PROMOTING COMPOSITION

FIELD OF THE INVENTION

The present invention relates to compositions useful for treating metal surfaces, such as copper and copper alloy surfaces, in the manufacture of printed circuit boards (PCB's).

BACKGROUND OF THE INVENTION

Printed circuits containing one or more circuit innerlayers are in prominent use today as demand increases for further and further weight and space conservation in electronic devices. Multilayer PCB's are constructed by layering imaged conductive layers of copper with dielectric layers to make a multilayer sandwich. The dielectric layers are usually organic resin layers that bond the copper layers together. Typically, the layers of copper and dielectric are bonded together by the application of heat and pressure. While the surface of the copper is smooth, it does not easily bond to the dielectric layer.

Successful fabrication of multi-layer printed circuit boards requires bonding together of copper and resin layers. However, direct bonding of copper and resin layers does not always provide sufficient bonding strength. It is therefore common to improve copper-resin bonding strength by providing surface roughness to the copper surface, thereby enhancing mechanical strength between the copper and resin layers. Surface roughness may be provided for example by mechanical cleaning (i.e., using buffing or scrubbing) or by chemical cleaning.

In one method of chemical treatment, surface roughness is provided to the copper surface by depositing an oxide layer on the copper surface, such as cuprous oxide, cupric oxide, or the like. Formation of the oxide layer, which turns the pink copper surface a brown-black color, creates minute unevenness on the copper surface, causing an interlocking effect between the copper surface and resin, thereby improving bonding strength.

Another method of improving the adhesion of dielectric material to a copper circuit trace uses a microetching technique. In microetching, no portion of the copper (e.g., copper circuitry traces) is completely etched away. Instead, the surface is etched (or oxidized) only to a limited extent so as to leave intact the original pattern of the copper being etched. Typically, the surface of the copper is etched only to a depth of between about 20 to about 500 μinches, as measured from the original surface to the depths of the microetching. This can be accomplished for example by choosing an appropriate microetching composition and limiting the extent of etching according to the parameters of the etching solution (including concentration, temperature, composition, etc.).

Low metal etch depths are advantageous for at least three reasons. First, a low etch depth removes less metal from the surface thereby leaving more of the original metal cross section intact. This is particularly important for circuit traces with impedance or resistance tolerances which must be maintained since these properties are directly related to the cross sectional area of the circuit. Second, low metal etch depths allow the opportunity for reworking defective parts. Lastly, low metal etch depths reduce the rate at which metal builds up in the adhesion promoting composition. Since metal build up in the microetching composition has an effect upon the ultimate useable life of the composition, lower etch depths lead to an extended useable life for the microetching solutions in terms of the maximum square feet of metal processable per gallon of the microetching composition.

Microetching and conversion coating solutions may be composed of hydrogen peroxide and an inorganic acid, such as sulfuric acid and phosphoric acid, as described for example in U.S. Pat. No. 5,800,859 to Price et al. and in U.S. Pat. Nos. 7,186,305, 6,554,948 and 6,383,272 all to Ferrier, the subject matter of each of which is herein incorporated by reference in its entirety.

Another type of microetching solution utilizes a cupric ion source, an organic acid, and a halide ion source, as described for example in U.S. Pat. No. 6,426,020 to Okada et al. and U.S. Pat. No. 5,807,493 to Maki et al., the subject matter of each of which is herein incorporated by reference in its entirety.

Another alternative oxide coating process is described in U.S. Pat. No. 7,351,353 to Bernard et al., the subject matter of which is incorporated herein by reference in its entirety. The Bernard patent describes a method and composition for providing roughened copper surfaces suitable for subsequent multilayer lamination. The method involves contacting a smooth copper surface with an adhesion promoting composition which includes an oxidizer, a pH adjuster, a topography modifier, and either a coating promoter or a uniformity enhancer.

While alternative conversion coating processes are advantageous over conventional oxide coating processes for a variety of reasons, the roughened copper surfaces formed by such processes exhibit chemical sensitivity and thus tend to be susceptible to chemical attack. Chemical attack typically occurs during post lamination processing steps. After a multilayer copper and dielectric sandwich is formed through the lamination process, certain post lamination processing steps are performed to prepare the multilayer PCB.

For example, "through-holes" are drilled through the multilayer sandwich in order to connect the inner layers of the circuit board. The act of drilling these holes typically leaves traces of resin smear on the through-hole interconnections that must be removed by a desmear process. One desmear process involves the application of a solvent sweller and a permanganate etch which can chemically attack the bond between the copper surface and dielectric resin at the site of the through holes. The permanganate etch is typically followed by an acid neutralizer which can chemically attack the bond and cause delamination. While other through-hole cleaning techniques are known, such as plasma etch or laser ablation, these processes generate intense heat which can also attack the copper/resin interface.

Once the desmear process is completed, the drilled holes are made conductive through direct metallization or similar processes. These processes involve numerous alkaline and acid processing steps, all of which can chemically attack the copper/resin interface. Further, the conductive through-hole is usually sealed with a layer of electrolytic copper. The electrolytic process involves alkaline and acidic baths which can also lead to chemical attack of the through-hole interconnects. The result of these chemical attacks may be the delamination of the sandwich layers in the area of the through holes.

The chemically attacked area is termed "pink ring" or "wedge void" in the circuit board industry. The formation of pink rings or wedge voids represents serious defects in the PCB's, especially in an era when increasingly high quality and reliability are demanded in the PCB industry.

Thus, there is a need for an improved oxide coating process that provides a surface that is less susceptible to chemical attack during post-lamination processing steps. In addition, there is a need for an improved oxide coating process that provides improved acid resistance during post-lamination processing steps.

Furthermore, there remains a need in the art for improved microetching compositions that can provide the desired degree of microetching in a copper or copper alloy surface while overcoming some of the difficulties noted in the prior art.

To that end, the inventors of the present invention have discovered that the use of a thiophosphate in the microetching composition, along with other additional optional additives, provides beneficial results with respect to resistance to chemical attack and improved acid resistance as compared with compositions of the prior art.

SUMMARY OF THE INVENTION

It is an object of the present invention to provide a copper surface roughening process that provides a surface that is less susceptible to chemical attack during post-lamination processing steps.

It is another object of the present invention to provide a copper surface roughening process that provides a surface that is more acid resistant during post-lamination processing steps.

It is another object of the present invention to provide a copper surface roughening process that does not suffer from the uniformity problems of conventional oxide processes.

It is still another object of the present invention to provide a copper surface roughening process that does not require multiple passes or high temperature.

To that end, the present invention relates generally to an improved microetching composition and a method of using the same to provide surface roughness to copper and copper alloy surfaces, in order to improve the bonding strength between a copper or copper alloy surface and a resin composition adhered thereto.

In one embodiment, the present invention is directed to a microetching composition comprising:
 a) an acid;
 b) an oxidizer;
 c) a corrosion inhibitor; and
 d) a thiophosphate or a phosphorus sulfide compound.

The present invention also relates to a method of microetching copper or copper alloy surfaces to increase the adhesion of the copper or copper alloy surface to a subsequently bonded polymeric material, the method comprising the steps of:
 1) contacting a copper or copper alloy surface with the composition of the invention; and thereafter
 2) bonding the polymeric material to the copper or copper alloy surface.

The inventors of the present invention have found that the foregoing composition significantly reduces the amount of copper etched during conversion coating formation as compared to prior art microetching composition while maintaining good adhesion promotion. In addition, the composition of the invention also provides good acid resistance.

The process proposed herein is particularly suited to the production of multilayered printed circuit boards.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

Figure 1:
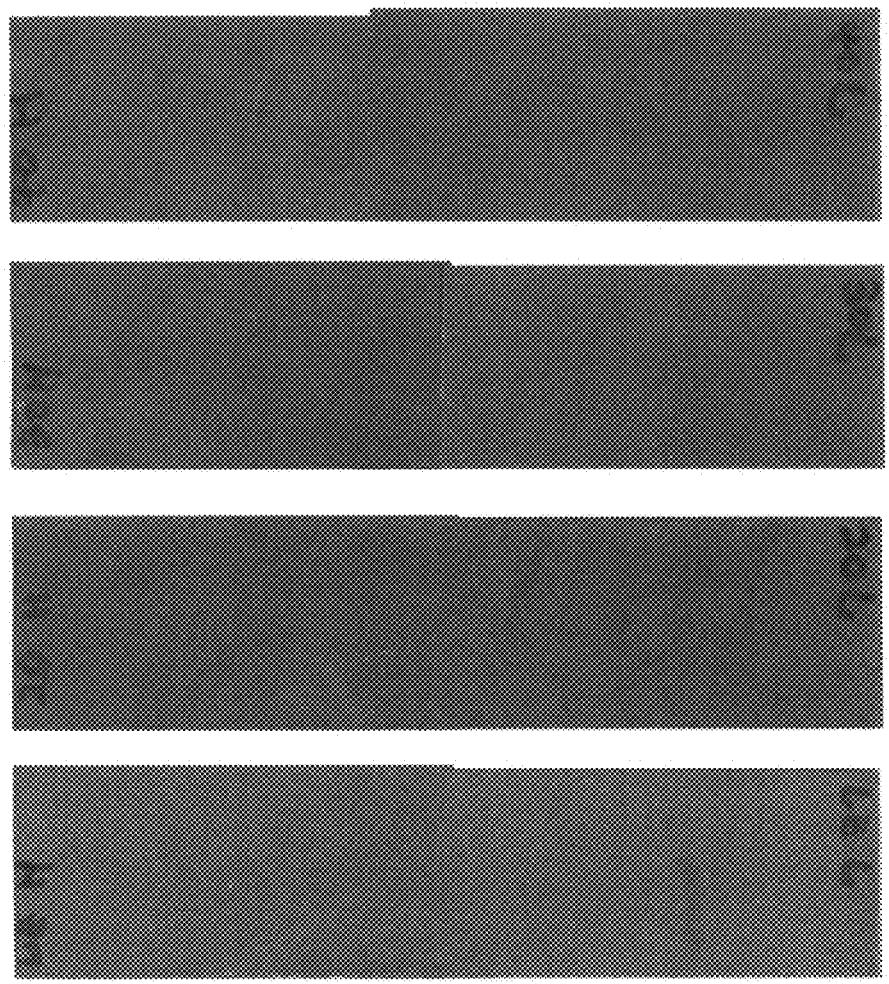
FIG. 1 depicts a color comparison of copper clad foil surfaces for various concentrations of $P_2S_5$ under high and low solution flow conditions.

The present invention relates generally to an improved microetching composition that reduces the amount of copper etched during film formation while maintaining good adhesion promotion. In addition, the composition of the invention also provides good acid resistance in subsequent processing steps.

In one embodiment, the present invention relates generally to a microetching composition comprising:
 a) an acid;
 b) an oxidizer;
 c) a corrosion inhibitor comprising a five-membered heterocyclic compound; and
 d) a thiophosphate or a phosphorus sulfide compound.

The oxidizer used in the microetching composition may comprise any oxidizer which is capable of oxidizing the metal surface in the matrix of the microetching composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may typically range from 0.5 to 120 grams per liter but is preferably from 2 to 60 grams per liter and is most preferably from 3 to 30 grams per liter.

The acid utilized in the microetching composition may be any acid which is stable in the matrix, including inorganic acids and organic acids. However, the inventors have found mineral acids to be particularly preferred. Other acids that may be used in compositions of the invention include hydrochloric acid, phosphoric acid, nitric acid, formic acid, acetic acid, sulfonic acid and toluene sulfonic acid, among others. Sulfuric acid is especially preferred. The concentration of the acid in the adhesion-promoting composition may range from 1 to 360 grams per liter but is preferably from 20 to 110 grams per liter.

The five membered heterocyclic compound is used as a corrosion inhibitor in compositions of the invention and effectively reacts with the metal surface to form a protective complex layer. Suitable five-membered heterocyclic compounds usable in the composition of the invention include triazoles, benzotriazoles, tetrazoles, imidazoles, benzimidazoles and mixtures of the foregoing. Benzotriazoles are particularly preferred. The concentration of the corrosion inhibitor in the adhesion-promoting composition may range from 0.1 to 50 grams per liter but is preferably from 0.2 to 5 grams per liter.

The thiophosphate in one embodiment may have the general formula $(R-X)_2-P=Z-Y-R$, wherein
 X and Y are O, S, or N;
 Z is S or O; and
 R is H, alkyl, alkylene or aryl.

Suitable phosphorous compounds are thiophosphates or phosphorous sulfide compounds that are usable in the composition of the invention including, but are not limited to, phosphorus pentasulfide, diethyl diphosphate ammonium salt, diethyl dithio phosphate, and 2,4-bis-(4-methoxyphenyl)-1,3,2,4-dithiodiphosphetane-2,4-disulfide. In one preferred embodiment, the phosphorous sulfide compound is phosphorus pentasulfide. The concentration of thiophosphate and/or phosphorous sulfide compounds in the working solution is preferably between about 1 and 1000 ppm, more preferably between about 20 and 100 ppm and most preferably between about 20 and 40 ppm.

The inventors of the present invention have determined that the use of phosphorus pentasulfide and/or thiophosphates helps to improve acid resistance of copper clad laminates during processes for making printed circuit boards. In addition, the inventors of the present invention have found that phosphorus pentasulfide and/or thiophosphates can beneficially be used in conversion coating working baths or in post-dip compositions. The thiophosphate or phosphorous sulfide can be compatible with many additives for the composition and have been found to work synergistically with carbonyl compounds which may be added to the composition of this invention.

The microetching conversion coating composition may also optionally but preferably contain a source of halide ions. The source of halide ions is used to assist in dissolving the metal (i.e. copper) and to ensure production of copper surfaces with superior adhesiveness and solderability. Fluoride ions, chloride ions, bromide ions, and the like can be used as the halide ion source, although chloride ions are generally preferred. The halide ions are added to the composition as a compound which can be dissociated into a halide ion in a solution. Examples of preferred sources of halide ions include alkaline metal salts such as sodium chloride, ammonium chloride, and potassium chloride, oxohalides such as sodium chlorate and potassium chlorate, halide bearing mineral acids such as hydrochloric acid, or copper chloride. In a preferred embodiment, the source of halide ions is sodium chloride To optimize performance of the microetching composition, other additives may be included in the composition of the invention. These additives are typically selected from the group consisting of, amines, polyamines, acrylamide, organic nitro compounds and molybdenum ions.

Suitable amines include N,N-diethylethanol amine, triethylene tetramine, glycine, and ethylene diaminetetraacetic acid. Suitable polyamines include P-400 (polyethyleneimine, MW 423, available from Aldrich Chemical Co.).

Suitable sources of molybdenum ions include any molybdenum-containing ion soluble in the aqueous solution of the invention. Preferred sources of molybdenum ions are molybdate salts, such as sodium molybdate, and phosphomolybdic acid. Other suitable sources of molybdenum ions include molybdic acid, molybdic anhydride, and salts of phosphomolybidic acid.

The present invention is also directed to an improved method of microetching copper or copper alloy surfaces to increase the adhesion of the copper surface to a polymeric material, the method comprising the steps of:
1) contacting a copper or copper alloy surface with the composition of the invention; and thereafter
2) bonding the polymeric material to the copper or copper alloy surface.

The process proposed is particularly suited to the manufacture of multilayer printed circuit boards. Thus, in this application, the metal circuitry (usually copper) of the innerlayers is treated with the composition proposed herein. After treatment, followed by water rinsing, the innerlayers are bonded together with polymeric materials such as pre-pregs or imageable dielectrics, resulting in the multilayer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The metal surface can be treated with the microetching composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 30 seconds to 2 minutes.

The following example is illustrative of the invention but should not be taken as limiting:

Example

Copper substrates were precleaned by contacting the substrates with M-Neutralizer (available from MacDermid, Inc. Waterbury Conn.) at 50° C. for one minute. The substrates were then rinsed for one minute.

Thereafter, the cleaned copper substrates were processed through an online process using the composition of the invention with a conveyance speed of about 0.6 feet per minute through the following steps:
1) alkaline cleaning at about 45±1° C. followed by a clean water rinse;
2) pre-dip in a 10% solution of the composition of the invention at 20±2° C.;
3) processed through the composition of the invention but without thiophosphate or phosphorous sulfide compounds at 30±1° C. based on the existing chemistry of the bath plus analysis and adjustment to the normal bath conditions.

The composition of the bath without the thiophosphate or phosphorous sulfide compounds was as follows:

| | |
|---|---|
| Sulfuric acid | 6.34% by weight |
| Hydrogen peroxide | 2.2% by weight |
| Benzotriazole | 0.709 g/l |
| Sodium Chloride | 15-25 ppm |

Thereafter, 20 ppm of $P_2S_5$ was added to the bath, based on a bath size of 60 gallons, using the following procedure:
1) A stock solution was made by weighing 4.42 grams of $P_2S_5$ powder with 99% purity and dissolving the powder in about 50 milliliters deionized water with 11.2 grams of 50% sodium hydroxide and then diluting the solution to the 100 milliliter level.
2) The stock solution was then added into about 20 liters of the bath described above and mixed for 1 to 2 hours, followed by filtering.
3) Thereafter, the filtered solution was added back to the sump of the tank containing the composition of the invention. After circulating for about 20 minutes, printed circuit board substrates were processed through the solution.

Testing was performed on various test strips and each test set included:

a) a 6"×4" strip of double sided copper clad coupon (etch rate coupon);
b) a 12"×18" double sided copper core (cut for peel strength coupons and for checking color/unevenness and comparing the top/bottom sides); and
c) a 9"×18" copper foil taped on a leading board (cut for peel strength coupons and for SEM studies)

Testing was conducted under high and low solution flow using the composition of the invention as follows:
1) Composition of the invention without $P_2S_5$ as a control;
2) Composition of the invention with 20 ppm $P_2S_5$;
3) Composition of the invention with 30 ppm $P_2S_5$;
4) Composition of the invention with 40 ppm $P_2S_5$.

In order to test the acid resistance of the coated metal panels, each test coupon was dipped halfway into a bath of 10% v/v hydrochloric acid at room temperature for 30 seconds and then rinsed and dried.

Figure 2:
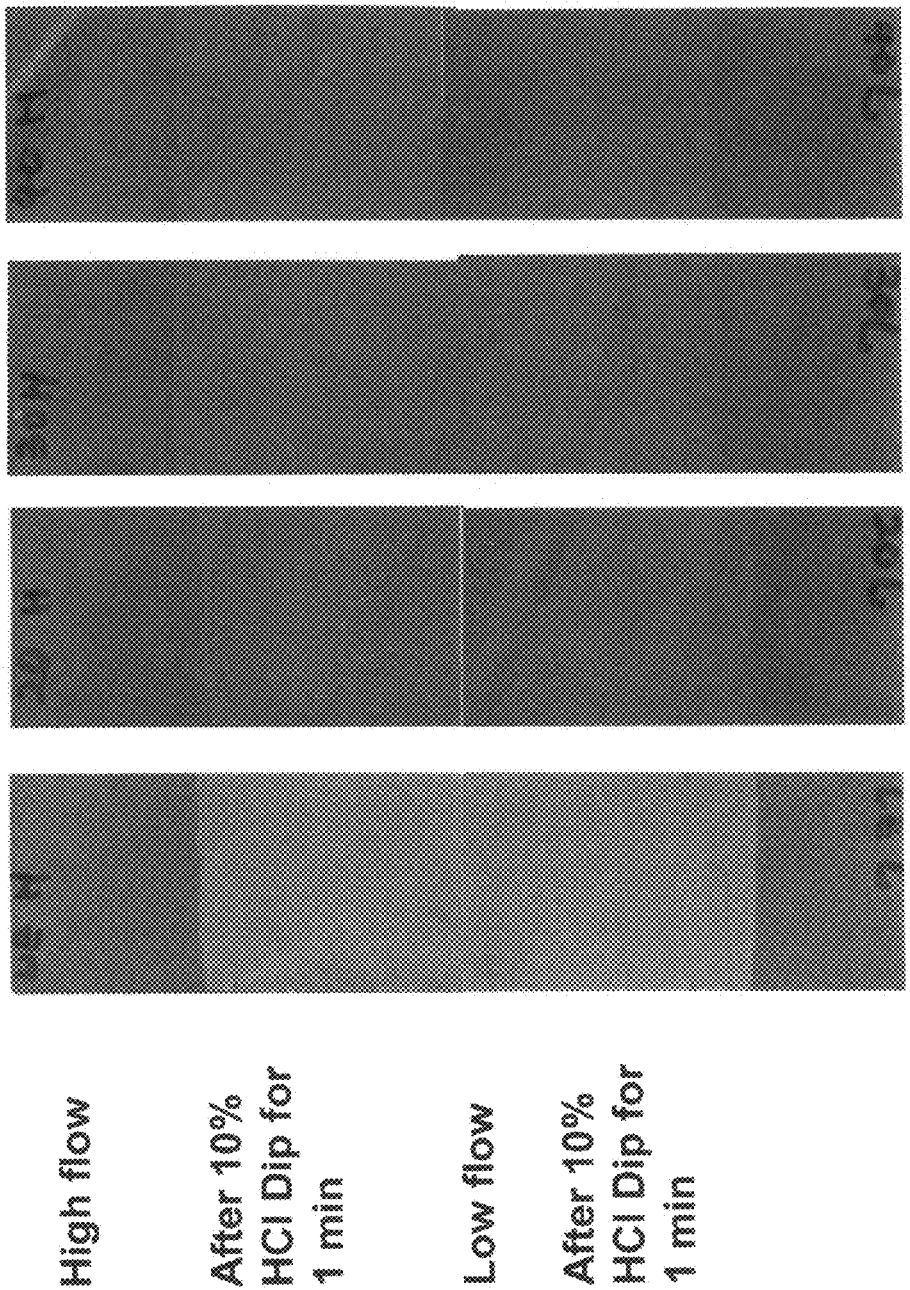
FIG. 2 depicts a color comparison of copper clad foil surfaces for various concentrations of $P_2S_5$ under high and low solution flow conditions after dipping the foils in a 10% HCl dip for 1 minute to test acid resistance.

Acid resistance tests and peel strength tests were performed on each test coupon. In the color resistance test, the color change is observed as an indicator of the level of resistance. The darker the area observed after 10% HCl test, the better the acid resistance of the metal panel. FIG. 1 depicts a color comparison of copper clad foil surfaces for various concentrations of $P_2S_5$ under high and low solution flow conditions. FIG. 2 depicts a color comparison of copper clad foil surfaces for various concentrations of $P_2S_5$ under high and low flow conditions after dipping the foils in a 10% HCl dip for 1 minute.

In the peel strength tests, two kinds of prepregs were analyzed—Isola 406 (available from Isola Group, Chander, Ariz.) and Nanya 140 (available from Nan Ya Printed Circuit Board Co, Taiwan RO) were applied during the layup and press.

The results of the tests described above are set forth in Tables 1 and 2, wherein Table 1 demonstrates the on-line test results of $P_2S_5$ in a composition of the invention with Isola 406 and Table 2 demonstrates the on-line test results of $P_2S_5$ in a composition of the invention with Nanya 140.

TABLE 1

On-line test results of $P_2S_5$ with Isola 406 Prepregs

| Ser. # | Bath flow[1] | Temp/time (° F./sec) | Conc. Of $P_2S_5$ (ppm) | Etch Amt. (µin) | Peel strength (lb/in) 0xSS | 3xSS | 6xSS | Color change | Remarks |
|---|---|---|---|---|---|---|---|---|---|
| 5 | H | 90/60 | 0 | 47.8 | 5.0 | 4.1 | 3.5 | Slight-moder. | Std. bath |
| 6 | L | 90/60 | 0 | 43.7 | 4.6 | 4.0 | 3.4 | Slight-moder. | Std. bath |
| 7 | H | 90/60 | 20 | 47.1 | 5.2 | 4.0 | 3.4 | Slight-moder. | Std. bath + 20 ppm $P_2S_5$ |
| 8 | L | 90/60 | 20 | 43.1 | 5.1 | 4.1 | 3.6 | Slight-moder. | Std. bath + 20 ppm $P_2S_5$ |
| 9 | H | 90/60 | 30 | 45.3 | 5.1 | 4.0 | 3.3 | Slight-moder. | Std. bath + 30 ppm $P_2S_5$ |
| 10 | L | 90/60 | 30 | 43.6 | 5.0 | 4.2 | 3.6 | Slight-moder. | Std. bath + 30 ppm $P_2S_5$ |
| 11 | H | 90/60 | 40 | 43.9 | 5.1 | 4.3 | 3.5 | Slight-moder. | Std. bath + 40 ppm $P_2S_5$ |
| 12 | L | 90/60 | 40 | 41.2 | 5.0 | 4.3 | 3.5 | Slight-moder. | Std. bath + 40 ppm $P_2S_5$ |

TABLE 2

On-line test results of $P_2S_5$ with Nanya 140 Prepregs

| Ser. # | Bath flow[1] | Temp/time (° F./sec) | Conc. Of $P_2S_5$ (ppm) | Etch Amt. (µin) | Peel strength (lb/in) 0xSS | 3xSS | 6xSS | Color change | Remarks |
|---|---|---|---|---|---|---|---|---|---|
| 5 | H | 90/60 | 0 | 47.8 | 5.1 | 4.5 | 4.2 | slight | Std. bath |
| 6 | L | 90/60 | 0 | 43.7 | 4.7 | 4.3 | 3.8 | slight | Std. bath |
| 7 | H | 90/60 | 20 | 47.1 | 5.2 | 4.5 | 4.1 | slight | Std. bath + 20 ppm $P_2S_5$ |
| 8 | L | 90/60 | 20 | 43.1 | 5.2 | 4.5 | 4.0 | slight | Std. bath + 20 ppm $P_2S_5$ |
| 9 | H | 90/60 | 30 | 45.3 | 5.3 | 4.7 | 4.2 | slight | Std. bath + 30 ppm $P_2S_5$ |
| 10 | L | 90/60 | 30 | 43.6 | 5.1 | 4.4 | 4.1 | slight | Std. bath + 30 ppm $P_2S_5$ |
| 11 | H | 90/60 | 40 | 43.9 | 5.3 | 4.5 | 4.0 | slight | Std. bath + 40 ppm $P_2S_5$ |
| 12 | L | 90/60 | 40 | 41.2 | 5.1 | 4.4 | 3.9 | slight | Std. bath + 40 ppm $P_2S_5$ |

In particular, it is noted that $P_2S_5$ works with the standard bath and improves the surface color (darker and more even) and acid resistance, with a slight positive impact on peel strength as set forth above in Tables 1 and 2.

Figure 3:
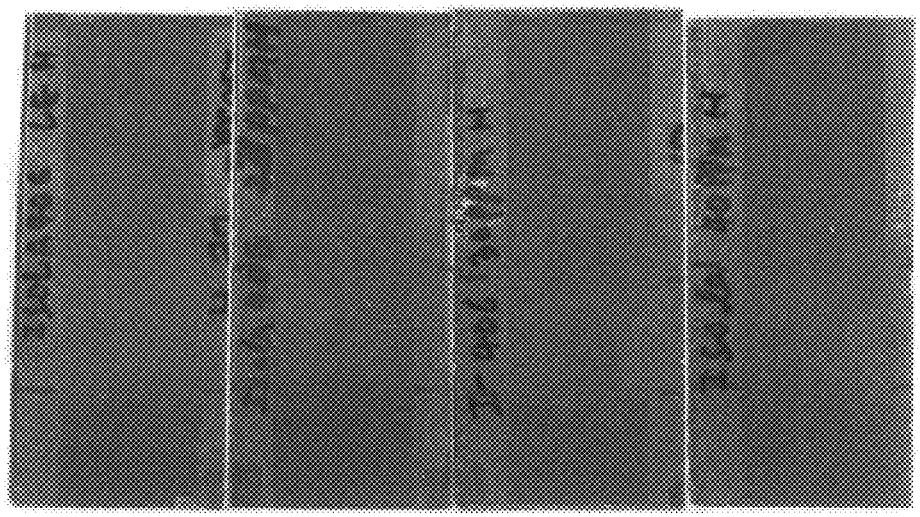
FIG. 3 depicts a color comparison of copper clad foil surfaces laminated with two resins: (1) Nanya FR4 140 resin (available from Nan Ya Printed Circuit Board Co, Taiwan ROC); and (2) FR406 resin (available from Isola Group, Chander, Ariz.).
Figure 3:
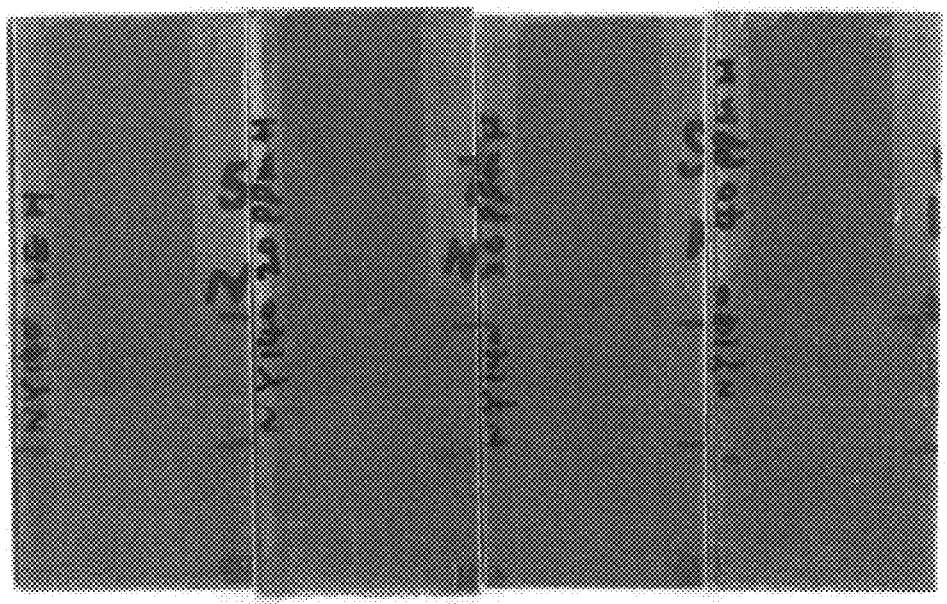

FIG. 3 depicts a color comparison of copper clad foil surfaces laminated with two resins: (1) Nanya FR4 140 resin (available from Nan Ya Printed Circuit Board Co, Taiwan ROC); and (2) FR406 resin (available from Isola Group, Chander, Ariz.).

In addition, a concentration of approximately 20 ppm $P_2S_5$ in the bath showed the darkest color and least sludge. Thus, it is noted that approximately 20-25 ppm in the new make-up with replenisher will be beneficial. Also, operating between 20-30 ppm with a tolerance in the range of about 10-40 ppm is typically desirable in most applications. Similar results were noted with the tests performed on the Nanya 140 prepregs and the Isola 406 prepregs, although there were slight improvements with regards to peel strength and thermostability for the Nanya 140 prepregs as compared with the Isola 406 prepregs. The color change of copper foil between 20-40 ppm $P_2S_5$ vs compositions not containing $P_2S_5$ after 3× or 6× solder shock was slight versus moderate.

It is also noted that the thiophosphate or phosphorous sulfide compounds of the invention can be used in both the bath composition itself and in post-dip compositions. However, the use of the thiophosphate in the post-dip composition is typically at a smaller concentration. For example, a composition of 5-10 ppm thiophosphate or phosphorous sulfide compounds in the post-dip composition may beneficially be used.

Finally, while the invention has been particularly shown and described with respect to preferred embodiments thereof, it will be understood that changes in form and details may be made therein without departing from the scope and spirit of the invention.

What is claimed is:

1. A process for preparing metal surfaces, comprising copper or a copper alloy, for subsequent lamination and improving acid resistance, said process comprising the steps of:

(a) contacting the metal surface with an adhesion promoting composition under conditions effective to provide a roughened metal surface that has improved acid resistance, said composition comprising:
        i) an oxidizer;
        ii) an acid;
        iii) a corrosion inhibitor comprising a five-membered heterocyclic compound;
        iv) a phosphorous compound selected from the group consisting of thiophosphates, phosphorous sulfides, and diethyl diphosphate ammonium salt;
    (b) bonding a polymeric material to the metal surface.

2. The method according to claim 1, wherein the metal surface is a copper clad laminate.

3. The method according to claim 1, wherein the five-membered heterocyclic compound is selected from the group consisting of triazoles, tetrazoles, imidazoles, benzimidazoles, derivatives thereof, and combinations of one or more of the foregoing.

4. The method according to claim 1, wherein the phosphorous compound is selected from the group consisting of phosphorus pentasulfide, diethyl diphosphate ammonium salt, diethyl dithio phosphate, and 2,4-bis-(4-methoxyphenyl)-1,3,2,4-dithiodiphosphetane-2,4-disulfide.

5. The method according to claim 4, wherein the phosphorous compound comprises phosphorus pentasulfide.

6. The method according to claim 5, wherein the phosphorus pentasulfide has a concentration of between about 1 and 1000 ppm.

7. The method according to claim 6, wherein the phosphorus pentasulfide has a concentration of between about 20 and 100 ppm.

8. The method according to claim 7, wherein the phosphorus pentasulfide has a concentration of between about 20 and about 40 ppm.

9. The method according to claim 1, wherein the composition comprises a source of halide ions.

* * * * *